(12) United States Patent
Zegdoun et al.

(10) Patent No.: US 8,581,902 B2
(45) Date of Patent: Nov. 12, 2013

(54) REDUCING THE SIZE OF A MODEL USING VISIBILITY FACTORS

(75) Inventors: Olivier Zegdoun, Tyngsborough, MA (US); Bruce W. Holway, Brewster, MA (US); Amit Mandloi, Acton, MA (US); Adarsh Krishnamurthy, Berkeley, CA (US)

(73) Assignee: Dassault Systems SolidWorks Corporation, Waltham, MA (US)

( * ) Notice: Subject to any disclaimer, the term of this patent is extended or adjusted under 35 U.S.C. 154(b) by 807 days.

(21) Appl. No.: 12/354,290

(22) Filed: Jan. 15, 2009

(65) Prior Publication Data

US 2009/0187385 A1 Jul. 23, 2009

Related U.S. Application Data

(60) Provisional application No. 61/021,775, filed on Jan. 17, 2008.

(51) Int. Cl.
*G06T 17/00* (2006.01)

(52) U.S. Cl.
USPC ............ 345/420; 345/421; 345/422; 345/423

(58) Field of Classification Search
USPC ......................................................... 345/420
See application file for complete search history.

(56) References Cited

U.S. PATENT DOCUMENTS

| 7,973,789 B2 * | 7/2011 | Cook | 345/420 |
|---|---|---|---|
| 2007/0291029 A1 | 12/2007 | Konev et al. | |
| 2008/0024507 A1 | 1/2008 | Pelletier-Doyle et al. | |

FOREIGN PATENT DOCUMENTS

| JP | 2002-279005 | 9/2002 |
| JP | 2003-044870 | 2/2003 |
| JP | 2003-141189 | 5/2003 |
| JP | 2006-227744 | 8/2006 |
| WO | WO 00/19381 | 4/2000 |
| WO | WO 2006/105416 A2 | 10/2006 |
| WO | WO 2009/091571 A1 | 7/2009 |

OTHER PUBLICATIONS

Brüderlin, B, et al., "Interviews3D: A Platform for Interactive Handling of Massive Data Sets," IEEE Computer Society, pp. 48-59, Nov./Dec. 2007.
International Search Report and Written Opinion of PCT/US2009/000258 date of mailing May 11, 2009.
Notification of Transmittal of International Preliminary Report on Patentability of PCT/US2009/000258 dated Jul. 29, 2010.
www.cgafaq.com, "Evenly distributed points on sphere," retrieved from internet, 1 page, date of publication not available.

(Continued)

*Primary Examiner* — Said Broome
*Assistant Examiner* — Peter Hoang
(74) *Attorney, Agent, or Firm* — Hamilton, Brook, Smith & Reynolds, P.C.

(57) ABSTRACT

A computer-implemented method and system reduces size of a data structure of a computer-aided design (CAD) model. Given a CAD model formed of a plurality of modeling elements, the method and system provide one or more geometric entities defining modeling elements of the CAD model. The geometric entities have corresponding graphical entities configured to display the CAD model. For each modeling element, the method and system determine visibility of the modeling element and produce a reduced data structure by storing in the structure graphic data representing the graphical entities and geometric data of only certain ones of the geometric entities determined as a function of visibility of the corresponding modeling elements.

18 Claims, 7 Drawing Sheets

(56) References Cited

OTHER PUBLICATIONS www.math.niu.edu, "pg_saff.py-Saff and Kuijlaars spherical distribution," retrieved from internet May 26, 2005, 2 pages.
Randazzo, J., "Jell-o Molds and Cookie Cutters—Shrinkwrap is Not just for Leftovers," www.profilemagazine.com, retrieved from Internet, Jan. 7, 2008, 1 page.
www.ptc.com, "Shrinkwrap Feature Enhancements," retrieved from Internet, Jan. 7, 2008, 1 page.
SolidWorks 2003 Online User's Guide, "Multibody Parts versus Assemblies," 1 page, date of publication not available.
Massachusetts Institute of Technology, "Rapid Visibility Analysis" and "Viewing Directions," relevant pages are 22 and 23, date of publication not available.

* cited by examiner

REDUCING THE SIZE OF A MODEL USING VISIBILITY FACTORS

RELATED APPLICATION

This application claims the benefit of U.S. Provisional Application No. 61/021,775, filed on Jan. 17, 2008.

The entire teachings of the above application is incorporated herein by reference.

FIELD

This application relates to Computer-Aided Design (CAD), and more particularly, to reducing the size of a model using visibility factors.

BACKGROUND OF THE INVENTION

Computer-aided design (CAD) software allows a user to construct and manipulate complex three-dimensional (3D) models. A number of different modeling techniques can be used to create a 3D model. These techniques include solid modeling, wire-frame modeling, and surface modeling. Solid modeling techniques provide for topological 3D models, where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies. Parts and subassemblies are hereinafter collectively referred to as components.

Parts, subassemblies, and assemblies can be quite complicated. A model that contains 10,000 parts is not uncommon. CAD models of agricultural vehicles, recreational vehicles, and some printer devices may likely have more than 10,000 parts. Some design engineers may wait up to thirty minutes for a CAD system to open and display a model and up to one minute or more for the completion of a basic operation, such as dragging a part on the computer screen from one location to another, or mating two components. The more complex a model is (e.g., the greater the number of parts and features therein), the greater the load on the CAD system.

The length of time taken to display a CAD model is a function of a number of factors, including the configuration of the computer system on which the modeling application (CAD software) runs. The amount of memory and the speed of the hardware processors installed on the computer system affect the performance of the modeling application. Additionally, the level of detail of the CAD model being displayed and the functionality that can be supported by the model's components influence the performance of the modeling application because both affect the amount of data that is stored, loaded, and processed.

To display a model, a CAD system creates a graphical representation of the model's geometrical entities, typically by the triangulation of the surfaces of the CAD model. Thus, in general, a typical data structure for a CAD model consists of geometric data and graphics data for all model components. The graphical representation is then rendered on a computer monitor. Creating and maintaining all geometrical entities and the graphical representation of the model may impede system performance. To address performance issues, current state-of-the-art systems may create an alternative representation of a CAD model.

The SolidWorks® 2003 software product, developed by Dassault Systèmes SolidWorks Corporation of Concord, Mass., allows an assembly to be saved as a part document consisting only of the exterior faces or visible parts of the assembly. Saving an assembly as a smaller part document facilitates file sharing. For example, SolidWorks 2003 can save a design of an intricate motor assembly as a part document, which then can be sent to another person who wants to know if the motor assembly fits in a specific frame. Sending the part document to the other person not only enables a smaller file to be transmitted, but also can safeguard the design by not sharing all the design details.

Other alternative representations of a model that may be implemented include a geometric representation only created by manually selecting faces to be represented and a graphical representation only created by tessellating the exterior faces of the model, which is an imprecise representation of the underlying geometry.

Saving only the exterior faces or visible parts of an assembly as one part document has drawbacks, which include the lack of associativity to the full model such that any changes to the one part document are not reflected back to the individual part files or the assembly file. Additionally, when saving exterior faces, all outer faces are represented in the part document no matter how small or obscured. Moreover, the design engineer has no control or knowledge of which face is actually selected during a picking process because there is no link to the original faces in the assembly from the exterior faces.

Time-saving advantages can be obtained by only storing, loading, and processing the graphical representations of the geometric entities and not the geometric entities themselves because memory is conserved and/or less paging is required on systems without sufficient amounts of random access memory to support the geometric structures. However, geometrical entities are needed for certain operations, such as mating features and annotating a 2D or 3D model. Thus, state-of-the-art CAD systems could benefit by utilizing a system or method that creates a representation of a complex model that a user could interact with in real time and that supports geometric operations without impacting system performance.

SUMMARY OF THE INVENTION

An example embodiment of the present invention may be implemented in the form of a method or corresponding apparatus for reducing a size of a data structure of a computer-aided design model. The method and corresponding apparatus according to one embodiment of the present invention includes, given a computer-aided design model comprised of a plurality of modeling elements, providing one or more geometric entities defining each of the plurality of modeling elements of the computer-aided design model, the geometric entities having corresponding graphical entities configured to display the computer-aided design model. For each modeling element, determining visibility of the modeling element and producing a reduced data structure in a computer memory by storing in the reduced data structure (i) graphic data representing the graphical entities, and (ii) geometric data of only certain ones of the geometric entities determined as a function of visibility of the corresponding modeling element.

In another embodiment, determining visibility includes determining a respective visibility factor for each modeling element. In one example, the visibility factor is determined or otherwise calculated by generating viewing vectors that emanate from points that form a bounding enclosure around the computer-aided design model toward a center of the bounding enclosure. Then, for each viewing vector, determining a number of pixels corresponding to the modeling element that are visible when the modeling element is viewed in a direction of the viewing vector from a point along the viewing vector. The visibility of the modeling element, for example, is a sum of the number of pixels determined for each viewing vector.

In another example of the previous embodiment, determining the visibility factor considers any one or combination of size of the modeling element, level of obscurity of the modeling element, distance from the modeling element to the bounding enclosure, surface type of the modeling element, density of the modeling element, translucency of the modeling element, mass of the modeling element, whether the modeling element is a mating candidate, and whether the modeling element is a reference modeling element.

In yet another embodiment, for each modeling element, as a function of the visibility factor of the modeling element relative to a predefined threshold, storing in the reduced data structure, geometric data of the corresponding modeling element.

In one example, the certain ones of the geometric entities are further determined based on any one or combination of physical size of the corresponding modeling element, selection of the corresponding modeling element by a user, and modification of the predefined threshold by the user.

In still yet another embodiment, the certain ones of the geometric entities are further determined based on a modeling operation and visibility of each corresponding modeling element required to support the modeling operation. For example, the modeling operation is a mating operation and the certain ones of the geometric entities include exterior faces.

Another embodiment further comprises filtering the computer-aided design model to display only in an area, graphical entities corresponding to the certain ones of the geometric entities and the displaying in the area, effectively enables user selection of the certain ones of the geometric entities. In such an embodiment, graphical entities may be displayed in a manner that contrasts the graphical entities corresponding to the certain ones of the geometric entities. Alternatively, graphical entities corresponding to the certain ones of the geometric entities may be transparently displayed or removed from display.

The "modeling element" may be a face, a part or combination thereof (and alternatively may be generally referred to as a model element).

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

Figure 1:
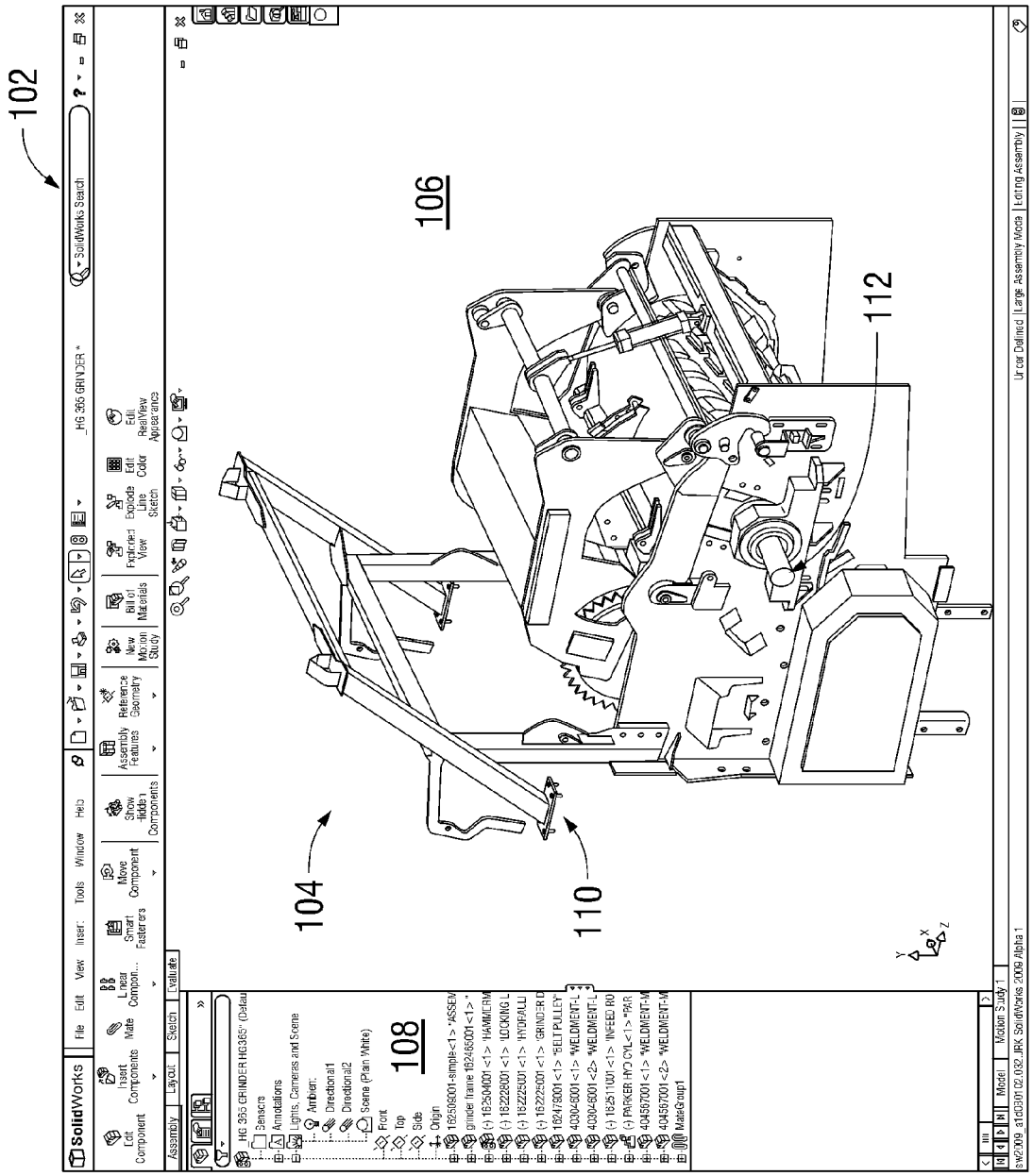
FIG. 1 is an illustration of a computer-generated model and a feature manager portion of a user interface displayed in a window in one embodiment of the present invention.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The present invention provides for efficient updates of a three-dimensional model by rendering the entire model while locally only storing geometric entities that are likely to be needed by a designated set of operations. The entire 3D model is rendered thereby enabling a design engineer to view the graphical representation of all geometric entities without storing all the geometric entities in local working memory. However, a subset of geometric entities is stored in local working memory to support operations often used when assembling components and adding the final details to a complex model.

The subset of geometric entities is determined based on a set of operations to be supported. When constructing an assembly, support for mating operations is desirable because subassembly features are often mated to construct an assembly. A mating operation requires selection of two or more geometric entities that are likely to be trimmed surfaces corresponding to exterior faces. (Hereinafter, geometric entities that are trimmed surfaces will simply be referred to as faces, which are the underlying topological entities.) Therefore, the subset of geometric entities in an embodiment of the present invention includes exterior faces and not interior faces. A subset of geometric entities consisting of exterior faces is also supportive of annotation operations, which along with mating operations are often used in the assembly context.

Referring now to FIG. 1, a window 102 displayed on a computer monitor is shown. The window 102 is generated by modeling software executed by a computerized modeling system, an example of which is later shown with reference to FIG. 7. The window 102 is a conventional computer-generated window that can be programmed by one of ordinary skill in the art using conventional, commercially available, software programming tools, such as those available from Microsoft Corporation of Redmond, Wash.

A computer-generated 3D model 104 is displayed within a modeling portion 106 of the window 102. The 3D model 104 in FIG. 1 is a subassembly designed by Vermeer Company of Pella, Iowa. The surfaces of the 3D model 104 can be displayed, or the 3D model 104 can be displayed using solid lines and dashed lines to show visible edges and hidden edges, respectively, of the 3D model. Moreover, surfaces can be transparent to reveal model components beneath such surfaces. Implementations also may include other window areas, such as a FeatureManager® window panel 108 in which the structure of a component, an assembly, or a drawing is listed to help the design engineer visualize and manipulate the 3D model 104, as well as components of the 3D model 104.

An embodiment of the present invention determines which geometric entities are likely to be mating candidates. Typically, mating candidates are exterior faces of a model. Additionally, larger faces may more likely be mating candidates in contrast to relatively smaller faces. Shown in FIG. 1 are a rectangular face 110 and a circular face 112 that are likely mating candidates to form a concentric or coincident mating relationship with another subassembly.

In general, the underlying data structure of a 3D model includes geometric and graphic data where the graphic data are processed for rendering the geometry of the 3D model. Additionally, solid models have topological representations to which the geometric representations correspond. The present invention creates a new data structure for a 3D model. The new data structure enables display of a full graphical representation of the 3D model. However, the new data structure only stores geometry for specific entities of the 3D model. Thus, a design engineer can modify and reference the geometry of the specific entities only.

Figure 2:
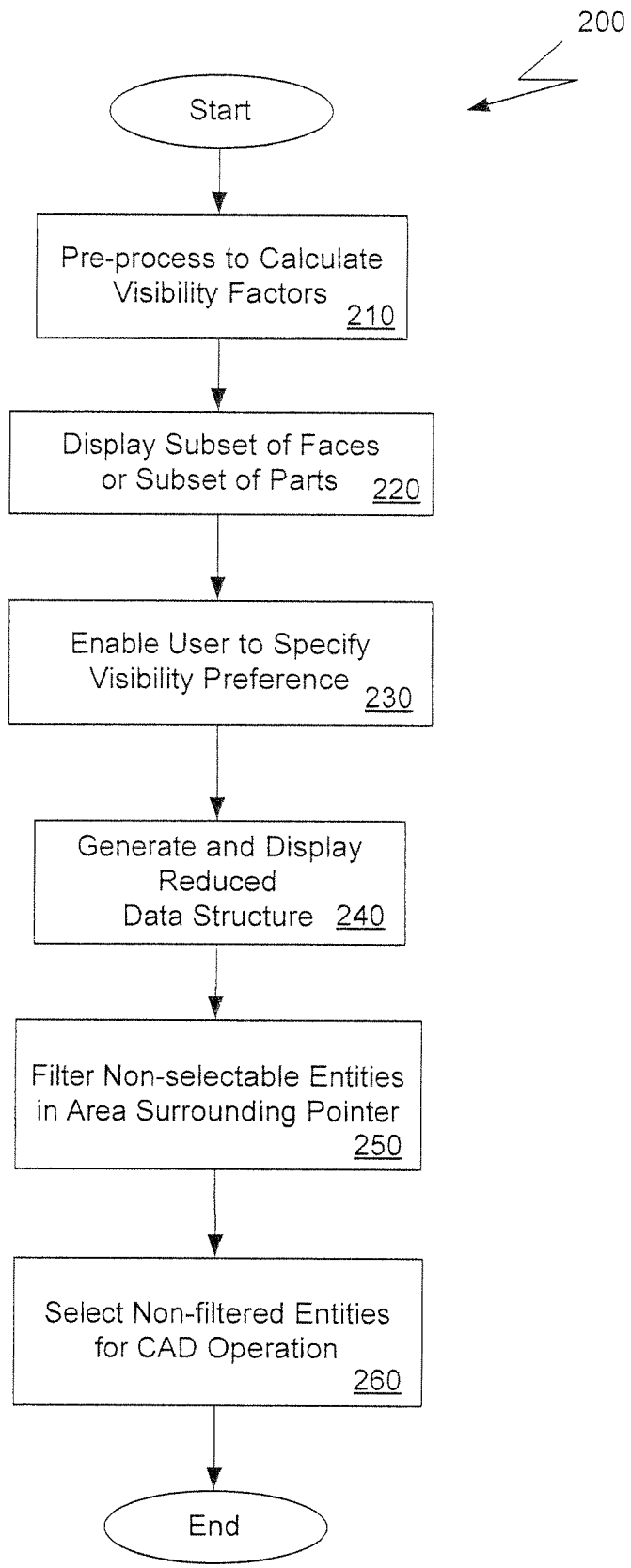
FIG. 2 is a flow diagram illustrating a process of one embodiment of the present invention.

FIG. 2 illustrates a procedure 200 of one embodiment of the present invention. Procedure 200 reduces the amount of data typically used to represent a 3D model and provides a user-friendly means by which certain model entities can be selected. To begin, procedure 200 pre-processes the model to calculate visibility factors for each face and each part (step 210), which is discussed in more detail with reference to FIG. 6. Faces and parts are generically termed modeling elements or model elements. After calculating the visibility factors, procedure 200 displays a subset of the model's faces or parts (step 220), which are the faces or parts assigned a visibility factor above a pre-determined threshold. In the next step, the design engineer may specify his or her visibility preference (step 230) thereby overriding the pre-determined threshold by specifying a new threshold.

Figure 3:
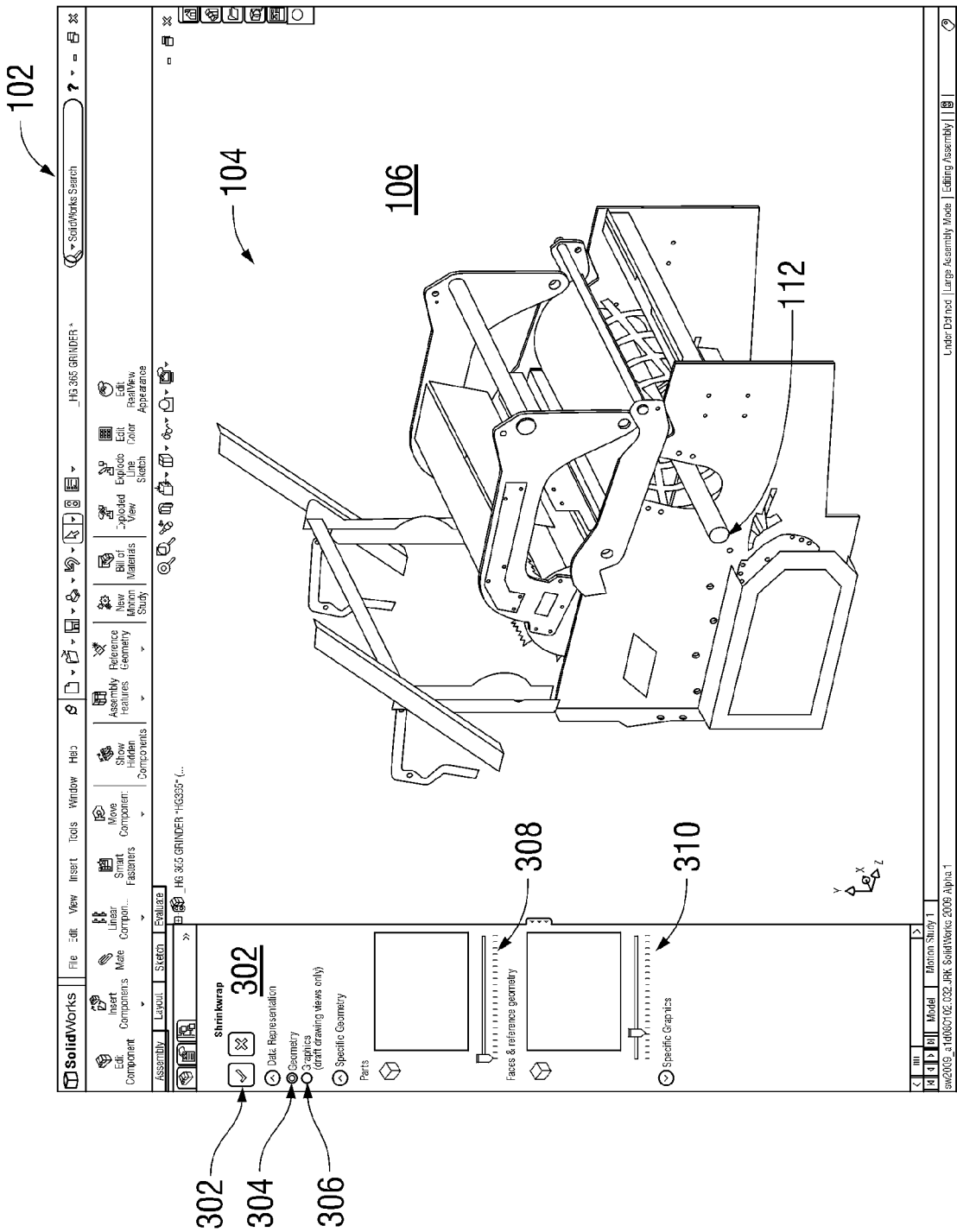
FIG. 3 is an illustration of the computer-generated model and a user interface displayed in another window in the FIG. 1 embodiment of the present invention.

To illustrate, FIG. 3 shows the model 104 after the visibility factors are calculated in step 210. Only a subset of faces is represented graphically, and therefore, is displayed in FIG. 3. If acceptable by the design engineer, the subset of faces shown and only those shown will have geometric data included in a reduced data structure that will also include graphic data for the entire model 104. In general, the subset of faces includes exterior faces that meet a visibility threshold. In contrast to FIG. 1, the circular face 112 is shown in FIG. 3 whereas the rectangular face 110 is not because rectangular face 110 did meet the visibility threshold, which may have included a size criterion. However, if the rectangular face 110 is needed, the design engineer can explicitly specify that geometric data for face 110 be generated. By way of non-limiting example, explicit specification can be accomplished by selecting rectangular face 110 using a mouse or other input/output (I/O) device with cursor control prior to the pre-processing step 210 of procedure 200.

Another means by which the design engineer can specify that geometric data for a face or part be included in the subset is to adjust a user interface control. Examples of such controls are a first slider 308 and a second slider 310 in window panel area 302 shown in FIG. 3. An embodiment of the present invention calculates visibility factors for all faces and all parts. The visibility factor not only considers the level of obscurity a part and a face have from numerous viewpoints, but also considers the size of a part or a face. The visibility factor is a numerical value assigned to each part and each face in the model. The visibility sliders (308, 310) enable a design engineer to specify the parts or faces displayed in window 102 by modifying the visibility threshold. For instance, moving second slider 310 to the right directs the modeling system to display faces with increasingly greater visibility factors, and therefore, directs the modeling system to display faces that are larger and less obscured than the faces displayed when the slider is positioned more leftward. Once the desirable faces are displayed, the design engineer indicates through radio buttons 304, 306, or other settings, that the displayed faces' geometric data are to be included in the subset. In the example embodiment of FIG. 3, the geometry radio button 304 when set causes the modeling system to display only the graphic data that supports that geometric data in the reduced data structure; the graphics radio button 306 when set causes the modeling system to display all the graphic data no matter whether or not the reduced data structure contains supporting geometric entities. By using a mouse (cursor control) device to select the checkmark button 312, the design engineer directs the modeling system to calculate a reduced data structure that will consist of the geometric data for the subset of faces (which is a modeling element) and the graphic data necessary to display all geometric entities.

Referring back to FIG. 2, the reduced data structure is generated and displayed (step 240) after the visibility preference is specified by accepting either the initial pre-processing results or the user-adjusted results reached after user interface controls are used (e.g., the visibility sliders (308, 310) described with reference to FIG. 3), by way of non-limiting example. As described, the reduced data structure includes the graphic data used to display the entire model not only the faces or parts that have corresponding geometric data. By displaying the entire model, the design engineer can visualize the entire model. However, the design engineer must be made aware of which faces or parts have geometric counterparts, and therefore, which faces or parts can be selected for operations such as operations that create mating relationships.

Typically, a design engineer uses a mouse (cursor control) device to select features and parts of a CAD model. The location corresponding to the mouse in the modeling portion 106 of the window 102 may be indicated by a pointer (cursor). An embodiment of the present invention, however, not only displays a pointer but also shows a circular area around the pointer. The purpose of the circular area is to create a filter zone whereby only graphical entities with corresponding geometric entities in the reduced data structure are displayed within the filter zone. In the next step of procedure 200, non-selectable entities (i.e., graphical entities without corresponding geometric entities) are filtered out of the filter zone (step 250) so only selectable entities (i.e., entities with both graphic and geometric data stored in the reduced data structure) appear in the filter zone. The final step 260 of procedure 200 enables the design engineer to select a non-filtered entity for a CAD operation, that is, an entity having supporting geometry in the reduced data structure.

Figure 4:
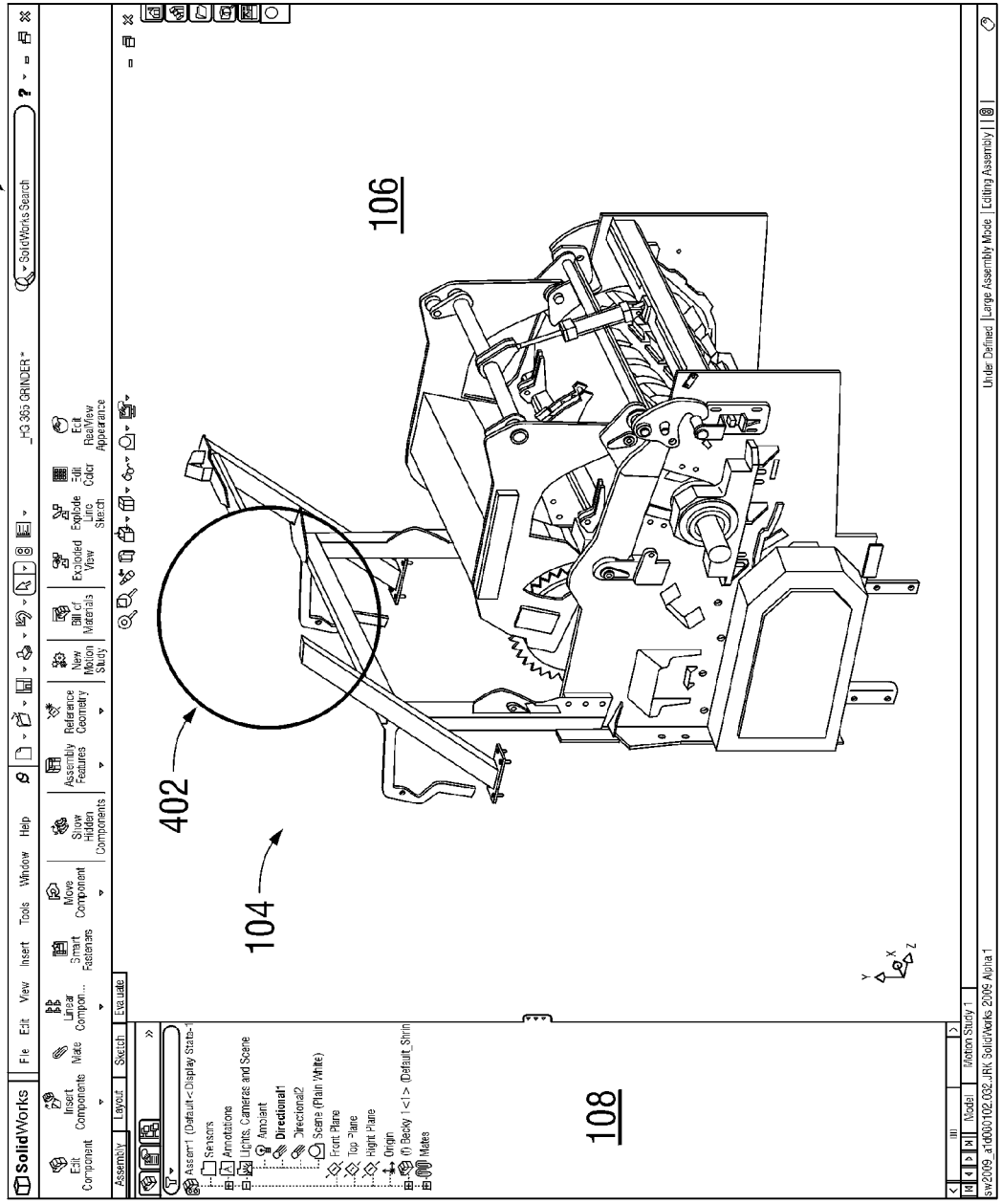
FIGS. 4 and 5 are illustrations of the computer-generated model and a user interface displayed in subsequent windows in the FIG. 1 embodiment of the present invention.
Figure 5:
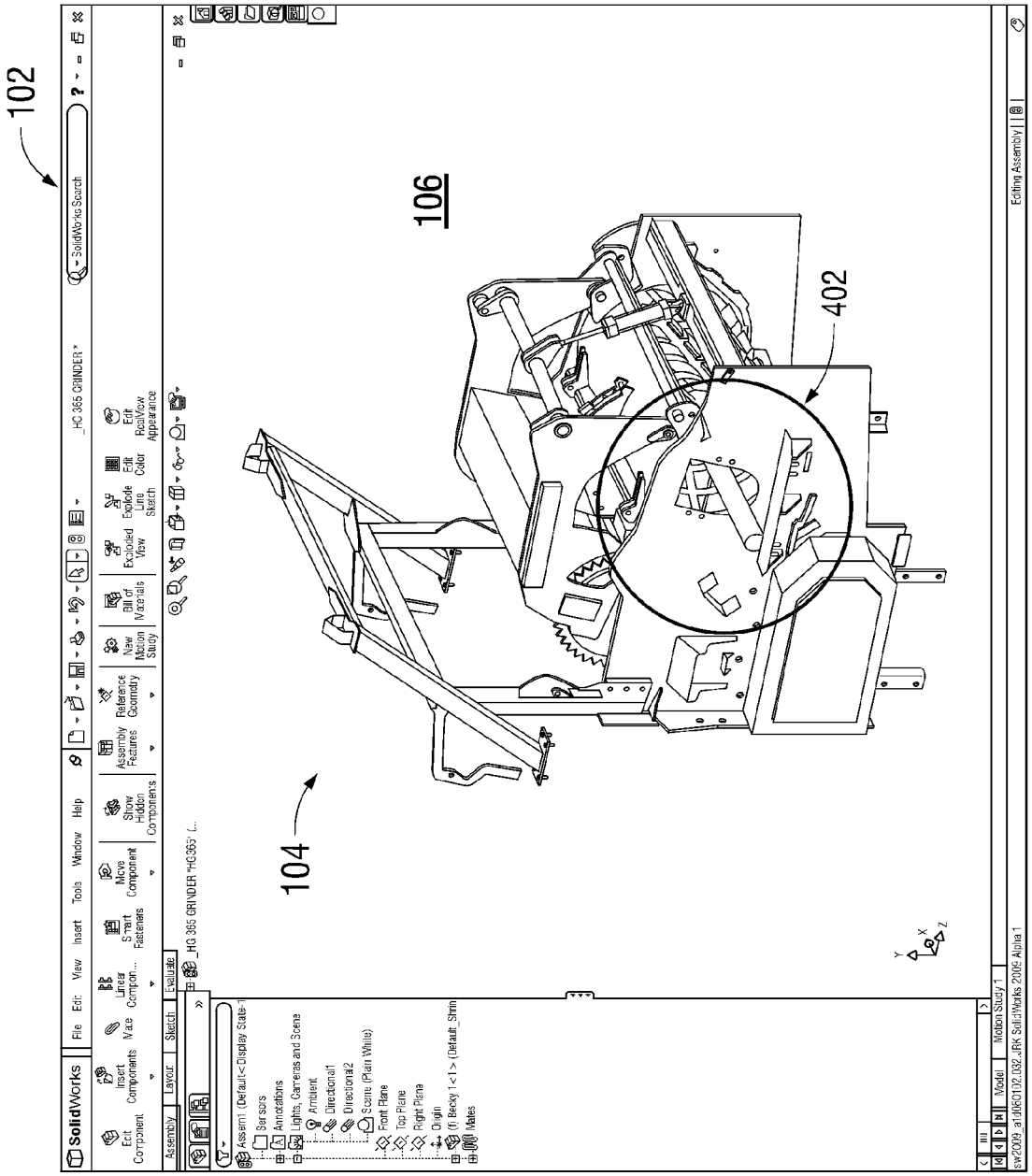

To illustrate, FIG. 4 and FIG. 5 display all graphical entities in model 104 except filtered graphical entities, which are graphical entities that do not have supporting geometric data in the reduced data structure and are within the filter zone 402. The location of the filter zone 402 differs in FIG. 4 and FIG. 5, and therefore, the graphical representation of some parts is displayed in FIG. 4 and not displayed in FIG. 5, and visa versa. Alternatively, an embodiment may display the filtered entities transparently rather than not display the filtered entities at all. An embodiment of the present invention interactively filters graphical entities surrounding the mouse pointer as the mouse moves over the model 104 (i.e., within filter zone 402) thereby providing immediate visual feedback to the design engineer regarding which entities are selectable. To accomplish this interactive feedback, a masking technique may be applied. Two images may be created of the model— one containing only the selectable graphical entities (denoted by parameters that flag selectable entities as such) within the filter zone 402 and the other containing all graphical entities. Then the two resulting images are dynamically blended together to compose the final image on screen, such that the non-selectable graphical entities are faded out within the filter zone 402.

Figure 6:
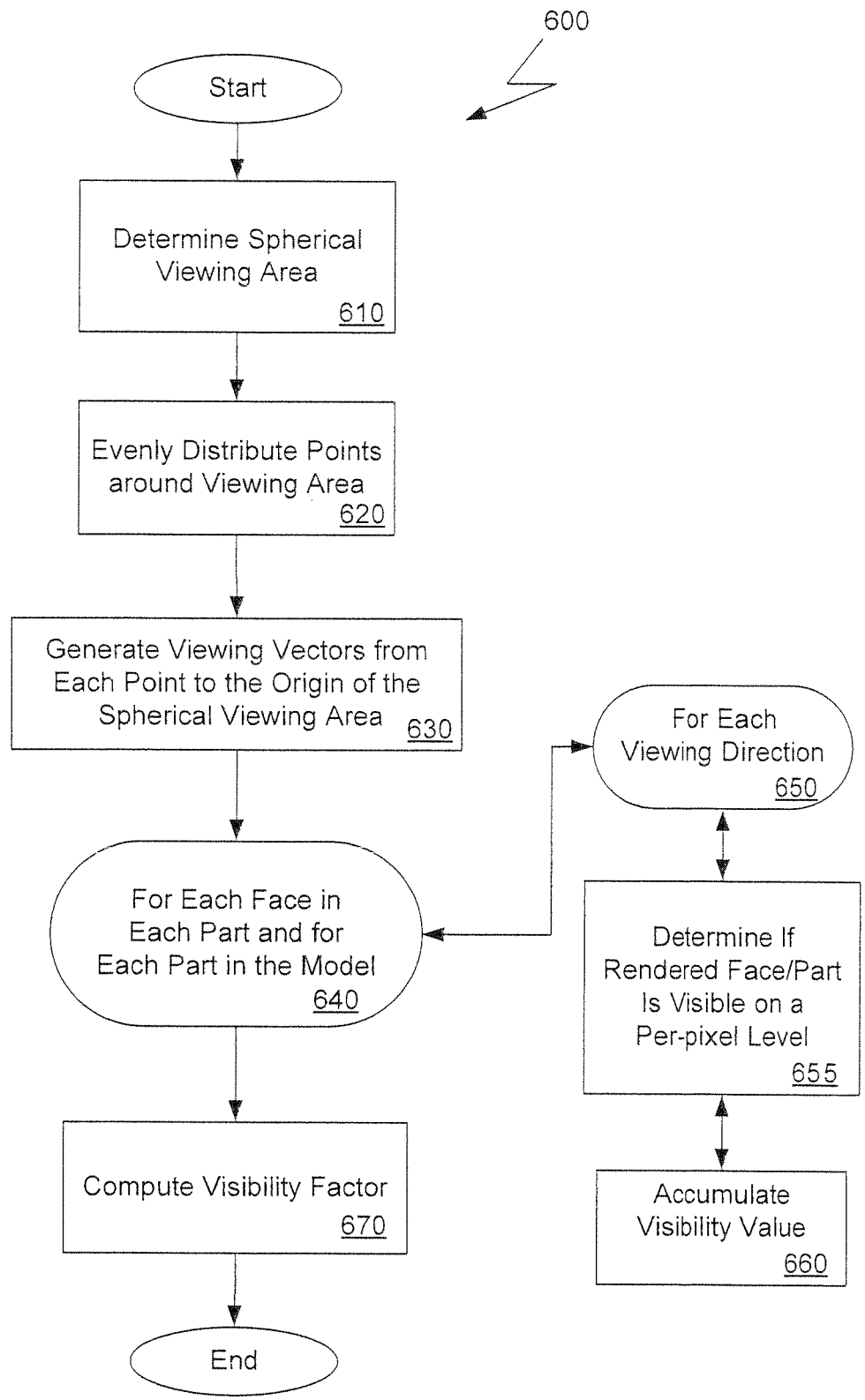
FIG. 6 is a flow diagram illustrating a process of one embodiment of the present invention.

Referring now to FIG. 6, a procedure 600 illustrates steps for determining the visibility of graphical entities and describes the pre-processing step 210 of procedure 200 in more detail. In the first step, a spherical viewing area is determined (step 610). The spherical viewing area surrounds a CAD model, such as model 104 shown in FIGS. 1, 3, 4, and 5. The spherical viewing area is used to determine how obscured features and parts are from various viewing directions. In the next step, points are evenly distributed around the spherical viewing area (step 620). Methods to distribute points on a sphere include a method described in "Distributing Many Points on a Sphere" by E. B. Saff and A. B. J. Kuijlaars. To resolve how many points to distribute around the spherical viewing area, empirical methods can be applied. One embodiment of the present invention distributes thirty-six points, which produces sufficiently accurate results without sacrificing performance.

Once points around the viewing area are saved, viewing vectors are generated emanating from each evenly distributed point toward the center of the spherical viewing area (step 630). Then for each part, the numbers of pixels that would be visible when the respective part is viewed in the directions of the viewing vectors from a point along a respective vector are calculated and summed (steps 640 through 660). Procedure 600 then determines the visibility of each face in the model in the same manner. That is, for each face the numbers of pixels that are visible when the face is viewed in the directions of the various viewing vectors from points along the respective vectors are summed (steps 650 through 660). The points from which the faces and parts are viewed may be the points determined in step 620 or points further away or closer to the model in the direction of the respective viewing vectors. Determining the number of pixels that would be visible may be accomplished by rendering the model off-screen and executing an occlusion query, which is a graphics function known by those skilled in the art.

The last step 670 in procedure 600 computes the visibility factor. The visibility factor may be based on the summed values of step 660. For example, the visibility factor for each face and part is equal to the respective summed number of visible pixels. In addition to the summed values, the visibility factor can account for the size of a face or the size of all faces in a part. By way of non-limiting example, a larger face will increase the value of a visibility factor more than a smaller face. Thus, although a face may be obscured when viewed from many of the viewpoints, the physical size of the face can increase the face's visibility factor.

Additionally, other properties and characteristics of a part and a face may be considered when computing the visibility factor. By way of non-limiting example, a part or face may be more heavily weighted in the visibility calculation the closer that part or face is to the outside of the spherical viewing area or to the extents of a bounding enclosure. Surface types may also be factored into the visibility calculation in that faces that are planes and cylinders are more heavily weighted than faces that are analytical surfaces. Properties such as density, translucency, and mass may also be considered in the visibility calculation. Furthermore, faces that have mates or references, and faces and parts that touch one another (which may be determined using interference detection), may be more heavily weighted in the visibility calculation or automatically selected for inclusion in the reduced data structure.

Implementations of the present invention may enable the reduced data structure to update the data structure in which all geometric entities are stored (herein referred to as the full data structure), thereby providing an associative link between the reduced data structure and the full data structure. An embodiment may store a reference identifier with each geometric entity in the reduced data structure, where the reference identifier is a pointer to the corresponding geometric entity in the full data structure. Alternatively, the reduced data structure may store the subset of geometric entities as a set of pointers to corresponding geometric entities in the full data structure. Thus, when two entities are chosen as mates in the reduced data structure, the data denoting the mating relationship will also be stored in the full data structure.

Moreover, the reduced data structure and the full data structure may be stored in the same hierarchical structure thereby facilitating the sharing of data since both the reduced and full data structures belong to the same overall data structure of a model.

Other techniques for associating between the reduced data structure and the full data structure are suitable, for example see U.S. patent application Ser. No. 11/344,457 filed on Jan. 30, 2006 for "Creating a Reference Using Tracking Data" by assignee and herein incorporated by reference.

Figure 7:
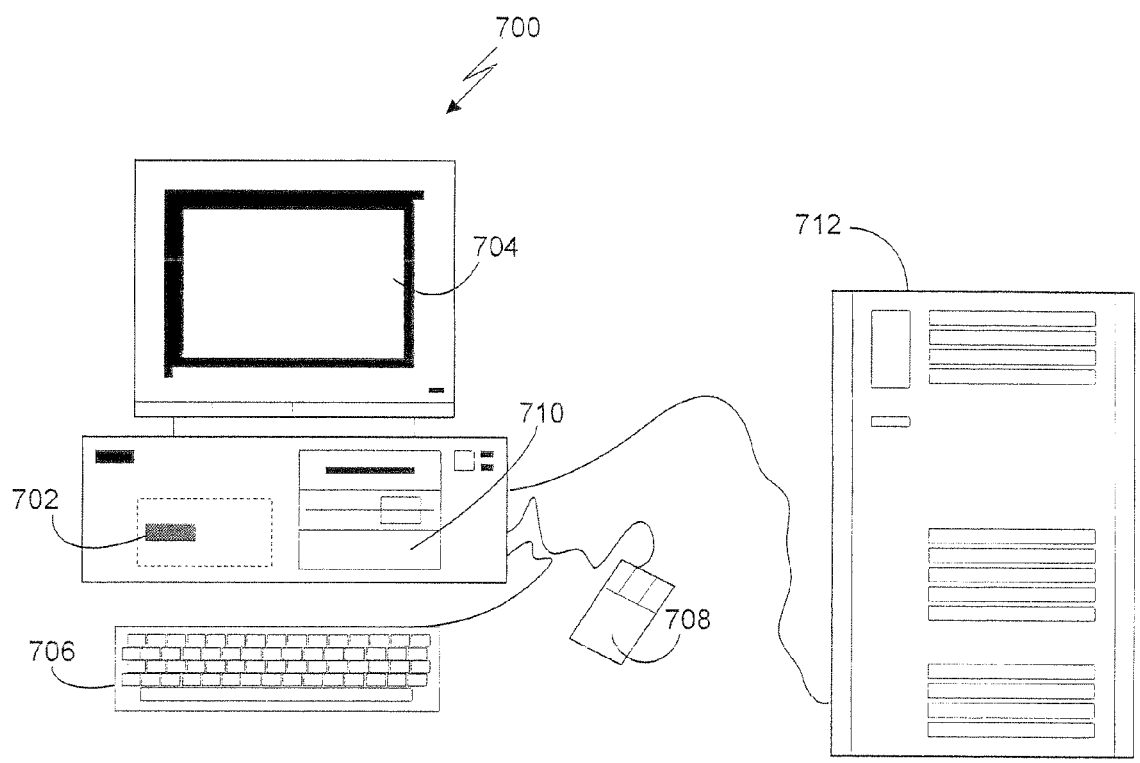
FIG. 7 is a schematic diagram of a computer system in which embodiments of the present invention are implemented.

Referring now to FIG. 7, a computerized modeling system 700 is shown and includes a CPU 702, a computer monitor 704, a keyboard input device 706, a mouse input device 708, and a storage device 710. The CPU 702, computer monitor 704, keyboard 706, mouse 708, and storage device 710 can include commonly available computer hardware devices. For example, the CPU 702 can include a Pentium-based processor. The mouse 708 may have conventional left and right buttons that the user may press to issue a command to a software program being executed by the CPU 702. As an alternative or in addition to the mouse 708, the computerized modeling system 700 can include a pointing device such as a trackball, touch-sensitive pad, or pointing device and buttons built into the keyboard 706. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft® Windows® 2000, Windows XP, Windows Vista®, UNIX®, Linux, or Mac OS® operating systems.

Additional computer processing units and hardware devices (e.g., graphic accelerator processors, rapid prototyping, video, and printer devices) may be included in the computerized modeling system 700. Furthermore, the computerized modeling system 700 may include network hardware and software thereby enabling communication to a hardware platform 712, and facilitating communication between numerous computer systems that include a CPU and a storage system, among other computer components.

Computer-aided modeling software may be stored on the storage device 710 and loaded into and executed by the CPU 702. The modeling software allows a user to create and modify a 3D model and implements aspects of the invention described herein. The CPU 702 uses the computer monitor 704 to display a 3D model and other aspects thereof as described. Using the keyboard 706 and the mouse 708, the user can enter and modify data associated with the 3D model. The CPU 702 accepts and processes input from the keyboard 706 and mouse 708. The CPU 702 processes the input along with the data associated with the 3D model and makes corresponding and appropriate changes to that which is displayed on the computer monitor 704 as commanded by the modeling software. In one embodiment, the modeling software is based on a solid modeling system that may be used to construct a 3D model consisting of one or more solid and surface bodies.

The invention may be implemented in digital electronic circuitry, or in computer hardware, firmware, software, or in combinations thereof Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Reducing the size of a data structure in the manner described herein realizes time-saving advantages afforded by storing, loading, and processing graphical representations of geometric entities, while supporting modeling operations, such as mating features and annotating computer-aided design model.

Designing complex models can be more interactive because less data needs to be processed during certain design stages. Being able to interact more rapidly with a complex model increases the productivity of a design engineer. When using a reduced data structure for an assembly model, the CAD system opens a design model more quickly, uses less memory, and still performs operations that are important to assembling a complex model. Moreover, the results of the operations performed on a reduced data structure are communicated back and automatically applied to the full data structure, meaning that the design engineer does not need to separately perform the same operations on the full data structure. Additionally, a reduced data structure as described herein has the advantage of not sacrificing visual details because all graphical entities are displayed while having a precise representation of the geometric entities deemed important.

Other advantages include the ability to load additional model information on demand, which is possible when the model file includes both the reduced data structure and the full data structure. Likewise, the present invention can exclude model information on demand. For example, when annotating a 2D drawing a design engineer may switch to the reduced representation to improve performance or to focus on selecting non-filtered geometric entities for annotation operations. Thus, switching between reduced data structure and full data structure functionality as the design process necessitates is a seamless transition.

A number of embodiments of the present invention have been described. Nevertheless, it will be understood that various modifications may be made without departing from the spirit and scope of the invention. For example, implementations may change the order in which operations are performed. Furthermore, depending on the needs of an implementation, particular operations described herein may be implemented as a combined operation, eliminated (e.g., step 230 in FIG. 2), added to, or otherwise rearranged.

Additionally, the embodiments described herein describe a reduced data structure, which may be a reduced data structure for an assembly, or a reduced data structure for a subassembly. The present invention can also be applied to create a reduced data structure of a complex part. Moreover, the filter zone has heretofore been described as a circular area, however, the filter zone may take on different shapes and opacity in the filter zone may be adjusted as well.

A number of embodiments of the present invention and their features have been described. Additional embodiments and features include computer-implemented methods for (1) displaying graphical entities in a manner that contrasts the graphical entities corresponding to certain ones of geometric entities, (2) transparently displaying and removing display of graphical entities corresponding to certain ones of geometric entities, and (3) associating a reduced data structure, as produced, with a full data structure that includes geometric data of each geometric entity. Further embodiments and features include computer-aided design systems having instructions to configure a processor to (1) store geometric data of a corresponding geometric entity in a reduced data structure as a function of visibility of a modeling element relative to a predefined threshold for each graphical entity, (2) further determine in which certain ones of geometric entities are based on any one or combination of physical size of the corresponding modeling element, selection of the corresponding modeling element by a user, and modification of the predefined threshold by the user, and (3) associate a reduced data structure, as produced, with a full data structure that includes geometric data of each geometric entity.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for reducing a size of a data structure of a computer-aided design model, the method comprising:
 given a computer-aided design model comprised of a plurality of modeling elements, providing one or more geometric entities defining each of the plurality of modeling elements of the computer-aided design model, the geometric entities having corresponding graphical entities configured to display the computer-aided design model;

for each modeling element, determining visibility of the modeling element; and producing a reduced data structure in a computer memory by storing in the reduced data structure:
  i) graphic data representing the graphical entities corresponding to the geometric entities defining each of the plurality of modeling elements of the computer-aided design model; and
  ii) geometric data of only certain ones of the geometric entities, each of the certain geometric entities being determined by at least one of: (a) a function of visibility of the corresponding modeling elements defined by said certain geometric entity, and (b) the certain geometric entity supporting a set of computer-aided design operations, after said storing of the graphic data of i) and the geometric data of ii), the reduced data structure resulting from said producing, and wherein:
  the resulting reduced data structure excludes geometric data of other ones of the geometric entities corresponding to modeling elements that are unnecessary to support the set of computer-aided design operations; and
  the computer-aided design model is efficiently updated by rendering entire said computer-aided design model while storing only the certain ones of the geometric entities in the resulting reduced data structure, and wherein determining the visibility includes determining a respective visibility factor for the modeling element including:
  generating viewing vectors that emanate from points that form a bounding enclosure around the computer-aided design model toward a center of the bounding enclosure; and
  for each viewing vector, determining a number of pixels corresponding to the modeling elements that are visible when the modeling element is viewed in a direction of the viewing vector from a point along the viewing vector, the visibility of the modeling element being a sum of the number of pixels determined for each viewing vector.

2. The computer-implemented method of claim 1, wherein determining the visibility factor includes considering any one or combination of size of the modeling element, level of obscurity of the modeling element, distance from the modeling element to the bounding enclosure, surface type of the modeling element, density of the modeling element, translucency of the modeling element, mass of the modeling element, whether the modeling element is a mating candidate, and whether the modeling element is a reference modeling element.

3. The computer-implemented method of claim 1, wherein for each modeling element, said storing in the reduced data structure includes storing of the geometric data of the corresponding modeling element as a function of the visibility factor of said corresponding modeling element relative to a predefined threshold.

4. The computer-implemented method of claim 3, wherein the certain ones of the geometric entities are further determined based on any one or combination of physical size of the corresponding modeling element, selection of the corresponding modeling element by a user, and modification of the predefined threshold by the user.

5. The computer-implemented method of claim 1, wherein the certain ones of the geometric entities are further determined based on a modeling operation and visibility of each corresponding modeling element required to support the modeling operation.

6. The computer-implemented method of claim 5, wherein the modeling operation is a mating operation and the certain ones of the geometric entities are associated with exterior faces.

7. The computer-implemented method of claim 1, further comprising:
  filtering the computer-aided design model to display only in an area, graphical entities corresponding to the certain ones of the geometric entities; and
  enabling user selection of the certain ones of the geometric entities.

8. The computer-implemented method of claim 1, wherein each modeling element is any one or combination of a face and a part.

9. A computer-aided design system to reduce a size of a data structure of a computer-aided design model, the system comprising:
  a processor operatively coupled to a data storage system, the data storage system storing in the data structure, a computer-aided design model comprised of a plurality of modeling elements; and
  a data storage memory operatively coupled to the processor and comprising instructions to configure the processor to:
    provide one or more geometric entities defining each of the plurality of modeling elements of the computer-aided design model, the geometric entities having corresponding graphical entities configured to display the computer-aided design model; and
    determine for each modeling element a visibility factor of the modeling element; and
    create a reduced data structure by storing:
      i) graphic data representing the graphical entities corresponding to the geometric entities defining each of the plurality of modeling elements of the computer-aided design model; and
      ii) geometric data of only certain ones of the geometric entities, each of the certain geometric entities being determined by at least one of:
        (a) a function of the visibility factor of the corresponding modeling elements defined by said certain geometric entity, and (b) the certain geometric entity supporting a set of computer-aided design operations,
  the reduced data structure resulting after said storing of the graphic data of i) and the geometric data of ii), and
  wherein:
    the created reduced data structure excludes geometric data of other ones of the geometric entities corresponding to modeling elements that are unnecessary to support the set of computer-aided design operations; and
    the computer-aided design model is efficiently updated by rendering entire said computer-aided design model while storing only the certain ones of the geometric entities in the reduced data structure, and
  wherein the visibility factor of the modeling element is determined by:
    generating viewing vectors that emanate from points that form a bounding enclosure around the computer-aided design model toward a center of the bounding enclosure; and
    for each viewing vector, determining a number of pixels corresponding to the modeling elements that are visible when the modeling element is viewed in a direction of the viewing vector from a point along the viewing vector, the visibility of the modeling element being a sum of the number of pixels determined for each viewing vector.

10. The computer-aided design system of claim 9, wherein the visibility factor of the modeling element is calculated by viewing the modeling element from a plurality of directions.

11. The computer-aided design system of claim 10, wherein the visibility factor also depends on any one or combination of size of the modeling element, level of obscurity of the modeling element, surface type of the modeling element, density of the modeling element, translucency of the modeling element, mass of the modeling element, and whether the modeling element is a mating candidate.

12. The computer-aided design system of claim 9, further comprising instructions to configure the processor to:
   filter the computer-aided design model to display only in an area, graphical entities corresponding to the certain ones of the geometric entities; and
   enable user selection of the certain ones of the geometric entities.

13. The computer-aided design system of claim 12, further comprising instructions to configure the processor to display graphical entities in a manner that contrasts the graphical entities corresponding to the certain ones of the geometric entities.

14. The computer-aided design system of claim 12, further comprising instructions to configure the processor to one of transparently display and remove display of the graphical entities corresponding to the certain ones of the geometric entities.

15. The computer-aided design system of claim 9, wherein the modeling element is any one or combination of face and a part.

16. A non-transitory computer-readable data storage medium comprising:
   executable programming instructions stored on the non-transitory computer-readable data storage medium, said instructions for causing a computer to:
      given a computer-aided design model comprised of a plurality of modeling elements, provide one or more geometric entities defining each of the plurality of modeling elements of the computer-aided design model, the geometric entities having corresponding graphical entities configured to display the computer-aided design model;
      for each modeling element, determine a visibility factor of the modeling element; and
      produce a reduced data structure by storing in the reduced data structure:
         i) graphic data representing the graphical entities corresponding to the geometric entities defining each of the plurality of modeling elements of the computer-aided design model; and
         ii) geometric data of only certain ones of the geometric entities, each of the certain geometric entities being determined by at least one of:
            (a) a function of visibility of the corresponding modeling elements defined by said certain geometric entity, and (b) the certain geometric entity supporting a set of computer-aided design operations,
   the reduced data structure resulting from said storing of the graphic data of i) and the geometric data of ii), and
   wherein:
      excluded from the produced reduced data structure are geometric data of other ones of the geometric entities corresponding to modeling elements that are unnecessary to support the set of computer-aided design operations; and
      wherein the computer-aided design model is efficiently updated by rendering entire said computer-aided design model while storing only the certain geometric entities in the reduced data structure, and
   wherein the visibility factor of the modeling element is determined by:
      generating viewing vectors that emanate from points that form a bounding enclosure around the computer-aided design model toward a center of the bounding enclosure; and
      for each viewing vector, determining a number of pixels corresponding to the modeling elements that are visible when the modeling element is viewed in a direction of the viewing vector from a point along the viewing vector, the visibility of the modeling element being a sum of the number of pixels determined for each viewing vector.

17. The non-transitory computer-readable data storage medium of claim 16, further comprising instructions for causing a computer to display graphical entities in a manner that contrasts the graphical entities corresponding to the certain ones of the geometric entities.

18. The non-transitory computer-readable data storage medium of claim 16, further comprising instructions to configure the processor to one of transparently display and remove display of the graphical entities corresponding to the certain ones of the geometric entities.

* * * * *

UNITED STATES PATENT AND TRADEMARK OFFICE
CERTIFICATE OF CORRECTION

PATENT NO. : 8,581,902 B2  
APPLICATION NO. : 12/354290  
DATED : November 12, 2013  
INVENTOR(S) : Olivier Zegdoun et al.

Page 1 of 1

It is certified that error appears in the above-identified patent and that said Letters Patent is hereby corrected as shown below:

Title Page, Item (73) Assignee  
delete "Systems" and insert --Systemes--.

Signed and Sealed this  
Fourteenth Day of January, 2014

Michelle K. Lee  
*Deputy Director of the United States Patent and Trademark Office*